(12) United States Patent
Siddik

(10) Patent No.: US 9,257,136 B1
(45) Date of Patent: Feb. 9, 2016

(54) MAGNETIC TUNNEL JUNCTIONS

(71) Applicant: Micron Technology, Inc., Boise, ID (US)

(72) Inventor: Manzar Siddik, Singapore (SG)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/704,023

(22) Filed: May 5, 2015

(51) Int. Cl.
*G11B 5/33* (2006.01)
*G11B 5/127* (2006.01)

(52) U.S. Cl.
CPC .................................. *G11B 5/127* (2013.01)

(58) Field of Classification Search
CPC ................... G11B 5/33; G11B 5/127
USPC ................ 360/324.2, 324.12, 324.1
See application file for complete search history.

(56) References Cited

U.S. PATENT DOCUMENTS

| | | | |
|---|---|---|---|
| 5,640,343 A | 6/1997 | Gallagher et al. | |
| 6,034,882 A | 3/2000 | Johnson et al. | |
| 6,603,677 B2 | 8/2003 | Redon et al. | |
| 6,788,502 B1 * | 9/2004 | Gill | 360/324.2 |
| 7,009,278 B2 | 3/2006 | Hsu | |
| 7,233,024 B2 | 6/2007 | Scheuerlein et al. | |
| 7,595,520 B2 | 9/2009 | Horng et al. | |
| 7,629,637 B2 | 12/2009 | Kajiyama et al. | |
| 7,660,153 B2 | 2/2010 | Yamane et al. | |
| 7,755,076 B2 | 7/2010 | Lung | |
| 7,944,738 B2 | 5/2011 | Liu et al. | |
| 7,983,065 B2 | 7/2011 | Samachisa | |
| 8,098,520 B2 | 1/2012 | Seigler et al. | |
| 8,102,700 B2 | 1/2012 | Liu et al. | |
| 8,124,968 B2 | 2/2012 | Koo et al. | |
| 8,218,357 B2 | 7/2012 | Liu et al. | |
| 8,310,861 B2 | 11/2012 | Liu et al. | |
| 8,338,224 B2 | 12/2012 | Yoon et al. | |
| 8,431,458 B2 | 4/2013 | Sills et al. | |
| 8,536,556 B2 | 9/2013 | Fukumizu | |
| 8,609,439 B2 | 12/2013 | Prejbeanu et al. | |
| 2002/0018355 A1 | 2/2002 | Johnson et al. | |

(Continued)

FOREIGN PATENT DOCUMENTS

| CN | 1339159 | 3/2002 |
|---|---|---|
| EP | 11845727.4 | 3/2014 |

(Continued)

OTHER PUBLICATIONS

U.S. Appl. No. 14/706,182, filed May 7, 2015, Harms et al.

(Continued)

*Primary Examiner* — Allen T Cao
(74) *Attorney, Agent, or Firm* — Wells St. John, P.S.

(57) ABSTRACT

A magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The magnetic recording material of the first electrode comprises a first crystalline magnetic region, in one embodiment comprising Co and Fe. In one embodiment, the first electrode comprises a second amorphous region comprising amorphous XN, where X is one or more of W, Mo, Cr, V, Nb, Ta, Al, and Ti. In one embodiment, the first electrode comprises a second region comprising Co, Fe, and N.

44 Claims, 4 Drawing Sheets

(56) References Cited

U.S. PATENT DOCUMENTS

| | | | |
|---|---|---|---|
| 2002/0079524 A1 | 6/2002 | Dennison | |
| 2004/0057295 A1* | 3/2004 | Matsukawa et al. | 365/200 |
| 2005/0006682 A1* | 1/2005 | Bae et al. | 257/295 |
| 2005/0174835 A1 | 8/2005 | Rinerson et al. | |
| 2005/0254289 A1 | 11/2005 | Nakajima et al. | |
| 2007/0243638 A1 | 10/2007 | Horng et al. | |
| 2008/0144234 A1* | 6/2008 | Lin | 360/324.11 |
| 2009/0261314 A1 | 10/2009 | Kim et al. | |
| 2009/0261343 A1 | 10/2009 | Herner et al. | |
| 2009/0323385 A1 | 12/2009 | Scheuerlein et al. | |
| 2010/0135061 A1 | 6/2010 | Li et al. | |
| 2010/0157657 A1 | 6/2010 | Rinerson et al. | |
| 2010/0259962 A1 | 10/2010 | Yan et al. | |
| 2011/0149646 A1 | 6/2011 | Liu et al. | |
| 2011/0309322 A1 | 12/2011 | Hwang | |
| 2012/0056285 A1 | 3/2012 | Bessho et al. | |
| 2013/0181305 A1 | 7/2013 | Nakayama et al. | |
| 2015/0069562 A1 | 3/2015 | Sandhu | |

FOREIGN PATENT DOCUMENTS

| | | |
|---|---|---|
| JP | 2008-034857 | 2/2008 |
| JP | 2009-267411 | 11/2009 |
| JP | 2010-010688 | 1/2010 |
| JP | 2010-232214 | 10/2010 |
| JP | 2010-263211 | 11/2010 |
| JP | 2012-523647 | 10/2012 |
| KR | 10-2008-0084590 | 9/2008 |
| KR | 2010-0083402 | 7/2010 |
| WO | WO 2010/101340 | 9/2010 |
| WO | PCT/US2011/059095 | 5/2012 |
| WO | PCT/US2011/059095 | 6/2013 |
| WO | PCT/US2014/047572 | 10/2014 |

OTHER PUBLICATIONS

U.S. Appl. No. 14/228,104, filed Mar. 27, 2014, Micron Technology, Inc.
U.S. Appl. No. 14/687,280, filed Apr. 15, 2015, Siddik et al.
U.S. Appl. No. 14/690,803, filed Apr. 20, 2015, Hineman.
Bai et al.; Boron diffusion induced symmetry reduction and scattering in CoFeB/MgO/CoFeB magnetic tunnel juntions; Physical Review B 87; Jan. 23, 2013; pp. 014114-1-014114-6.
Banderia et al.; Comparison of Synthetic Antiferromagnets and Hard Ferromagnets as Reference Layer in Magnetic Tunnel Junctions With Perpendicular Magnetic Anisotropy; IEEE Magnetic Letters, vol. 1; Jul. 8, 2010; 4 pp.
Buchikhaoui et al.; On the role of Ta cap in the recrystallization process of CoFeB layers; Appled Physics Letters 103; Oct. 3, 2013; pp. 14212-1-14212-5.
Brataas et al.; Spin Pumping and Spin Transfer; Condensed Matter > Mesoscale and Nanoscale Physics; Cornell University; Mar. 6, 2012; p. 1-30.
Burton et al.; Atomic and Electronic Structure of the Co Fe B MgO Interface From First Principles; Applied Physics Letters 89; Oct. 5, 2006; pp. 142507-1-142507-3.
Butler et al.; Spin-dependent tunneling conductance of Fe/MgO/Fe sandwiches; Physical Review B, vol. 63; Jan. 8, 2000; pp. 054416-1-054416-12.
Conca et al.; Annealing influence on the Gilbert damping parameter and the exchange constant of CoFeB thin films; Applied Physics Letters 104; May 8, 2014; pp. 182407-1-182407-4.
Devolder et al.; Damping of CoxFe80-xB20 ultrathin films with perpendicular magnetic anistropy; Applied Physics Letters 102; Jan. 15, 2013; pp. 022407-1-022407-4.
Feng et al.; Annealing of CoFeB/MgO Based Single and Double Barrier Magnetic Tunnel Junctions; Tunnel Magnetoresistance, Bias Dependence, and Output Voltage; Journal of Applied Physics 105; Feb. 11, 2009; pp. 033916-1-033916-7.
Hopp et al.; Chemical Composition and Iron Oxidation State Of The Amorphous Silicate Matrix in Acfer 094; 46th Lunar and Planetary Science Conference; Jan. 27, 2015; 2 pp.
Jang et al.; Variation in the properties of the interface in a CoFeB/MgO/CoFeB tunnel junction during thermal anealing; Applied Physics Letters 91; Sep. 4, 2007; pp. 102104-1-102104-3.
Jiang et al.; Sputtered FeCoN soft magnetic thin films with high resistivity; IEEE Transactions on Magnetics, vol. 39, No. 6; Nov. 2003; pp. 3559-3562.
Kuo et al.; Microstructure and magnetic propeprties of FeCoN thin films; Journal of Applied Physics vol. 83, No. 11; Jun. 1, 1998; pp. 6643-6645.
Kurt et al.; Boron diffusion in magnetic tunnel junctions with MgO (001) barriers and CoFeB electrodes; Applied Physics Letters 96; Jun. 28, 2010; pp. 262501-1-262501-3.
Liu et al.; Ferromagnetic resonance and damping properties of CoFeB thin films as free layers in MgO-based magnetic tunnel juctions; Journal of Applied Physics 110; Aug. 8, 2011; pp. 033910-1-033910-5.
Mathon et al.; Theory of tunneling magnetoresistance of an epitaxial FeO/MgO/Fe (?001)? Junction; Physical Review B, vol. 63; May 10, 2001; pp. 220403-1-22043-4.
Mizunuma et al.; MgO barrier-perpendicular magnetic tunnel junctions with CoFe/Pd multilayers and ferromagnetic insertion layers; Applied Physics Letters; Dec. 11, 2009; 17 pp.
Munira et al.; Comparative material issues for fast reliable switching in STT-RAMs; 2011 11th IEEE International Conference on Nanotechnology; Aug. 15-18, 2011; pp. 1403-1408.
Parkin et al.; Giant tunnelling magnetoresistance at room temperature with MgO (100) tunnel barriers; Nature Material, vol. 3; Dec. 31, 2004; pp. 862-867.
Rickart et al.; Exchange coupling of bilayers and synthetic antiferromagnets pinned to MnPt; The European Physics Journal B; Jan. 8, 2005; pp. 1-6.
Rumaiz et al.; Boron Migration due to annealing in CoFeB/MgO/CoFeB interfaces: A combined hard x-ray photoelectron spectroscopy and x-ray absorption studies; Appled Physics Letters 99; Nov. 28, 2011; pp. 222502-1-222502-3.
Sun et al.; Effect of Subvolume Excitation and Spin-Torque Efficiency on Magnetic Switching; Physical Review B-84; Aug. 19, 2011; pp. 064413-1-064413-9.
Tsunoda et al.; A Novel MTJ for STT-NRAM With a Dummy Free Layer and Dual Tunnel Junctions; Electron Device Meeting; Dec. 10-13, 2012; pp. 29.1.1-29.1.4.
You et al.; Boron segregation in crystallized MgO/amorphous-Co40Fe40B20 thin films; Journal of Applied Physics 104; Aug. 5, 2008; pp. 033517-1-033517-6.
Zang et al.; Large magnetoresistance in bcc Co/MgO/Co and FeCo/MgO/FeCo tunnel juctions; Physical Review B 70; Nov. 17, 2004; pp. 172407-1-172407-4.
U.S. Appl. No. 14/563,303, filed Dec. 8, 2014, Chen et al.
U.S. Appl. No. 14/684,110, filed Apr. 10, 2015, Sandhu.
U.S. Appl. No. 14/687,317, filed Apr. 15, 2015, Siddik.
U.S. Appl. No. 14/687,280, filed Apr. 15, 2015, Siddik.
U.S. Appl. No. 14/706,182, filed May 7, 2015, Harms.
Annealing influence on the Gilbert damping parameter and the exchange constant of CoFeB thin films; Conca et al.; Applied Physics Letter 104; May 8, 2014; pp. 182407-1-182401-4.
Annealing of CoFeB/MgO based single and double barrier magnetic tunnel junctions: Tunnel magnetoresistance, bias dependence, and output voltage; Feng et al; Journal of Applied Physics, vol. 105, Feb. 11, 2009; pp. 033916-1 to 033916-7.
Atomic and Electronic Structure of CoFeB/MgO Interface from First Principles; Burton et al.; Applied Physics Letters, vol. 89; Oct. 5, 2006; pp. 142507-1 to 142507-3.
Boron diffusion in magnetic tunnel junctions with MgO (001) barriers and CoFeB electrodes; Kurt et al.; Applied Physics Letters, vol. 96; Jun. 28, 2010; pp. 262501-1 to 262501-3.
Boron diffusion induced symmetry reduction and scattering in CoFeB/MgO/CoFeB magnetic tunnel junctions; Bai et al.; The American Physical Society; Physical Review B, vol. 87; Jan. 23, 2013; pp. 014114-1 to 014114-6.
Boron migration due to annealing in CoFeB/MgO/CoFeB interfaces: A combined hard x-ray photoelectron spectroscopy and x-ray absorption studies; Rumaiz et al.; Applied Physics Letters, vol. 99; Nov. 28, 2011; pp. 222502-1 to 222502-3.

(56) References Cited

OTHER PUBLICATIONS

Boron segregation in crystallized MgO/amorphous-Co 40 Fe 40 B 20 Co 40 Fe 40 B 20 Co 40 Fe 40 B 20 thin films; You et al.; Journal of Applied Physics, vol. 104, Aug. 5, 2008; pp. 033517-1 to 033517-6.
Comparative material issues for fast reliable switching in STT-RAMs; Munira et al.; 2011 11th IEEE International Conference on Nanotechnology; Aug. 15-18, 2012; pp. 1403-1408.
Comparison of Synthetic Antiferromagnets and Hard Ferromagnets as Reference Layer in Magnetic Tunnel Junctions With Perpendicular Magnetic Anisotropy; Bandiera et al.; Spin Electronics; IEE Magnetics Letters, vol. 1; Jul. 8, 2010; 4 pp.
Damping of $Co_xFe_{80-x}B_{20}$ ultrathin films with perendicular magnetic anisotropy; Devolder et al.; Applied Physics Letters 102; Jan. 15, 2013; pp. 022407-1-022407-4.
Exchange coupling of bilayers and synthetic antiferromagnets pinned to MnPt; Rickart et al.; The European Physical Journal B; Mar. 8, 2005; pp. 1-6.
Giant tunnelling magnetoresistance at room temperature with MgO (100) tunnel barriers; Parkin et al.; nature materials, vol. 3; Oct. 31, 2004; pp. 862-867.
Magnetic Tunnel Junctions; Zhu et al.; Materialstoday; vol. 9, No. 11; Nov. 2006; pp. 36-45.
Magnetoresistive Random-Access Memory; www.wikipedia.org/wiki/RAM; As downloaded from the Internet Jul. 28, 2013; 10 pp.
MgO barrier-perpendicular magnetic tunnel junctions with CoFe/Pd multilayers and ferromagnetic insertion layers; Mizunuma et al.; Laboratory for Nanoelectronics and Spintronics, Research Institute of Electrical Communication, Tohoku University; Advance Research Laboratory, Hitachi, Ltd.; Dec. 11, 2009; 17 pp.
Microstructure and magnetic properties of FeCoN thin films; Kuo et al.; Journal of Applied Physics, vol. 83, No. 11; Jun. 1, 1998; pp. 6643-6645.
On the role of Ta cap in the recrystallization process of CoFeB layers; Bouchikhaoui et al.; Applied Physics Letters, vol. 103; Oct. 3, 2013; pp. 142412-1 to 142412-5.
Spin Pumping and Spin Transfer; Brataas et al.; arXiv:1108.0385v3[cond-ma.tmes-hall]; Mar. 6, 2012; pp. 1-30.
Spin-dependent tunneling conductance of $Fe_zMgO_zFe$ sandwiches; Butler et al.; The American Physical Society; Physical Review B, vol. 63; Jan. 8, 2001; pp. 054416-1 to 054416-12.
Spin-Transfer Torque; www.wikipedia.org/wiki/Spin-transfer_torque; As downloaded from the Internet Aug. 2, 2013; 2 pp.
Sputtered FeCoN Soft Magnetic Thin Films With High Resistivity; Jiang et al.; IEEE Transactions on Magnetics, vol. 39, No. 6; Nov. 2003; pp. 3559-3562.
Status and Challenges for Non-Volatile Spin-Transfer Torque Ram (STT-RAM); Krounbi et al.; International Symposium on Advanced Gate Stack-Technology; Sep. 23, 2010; 28 pp.
Theory of tunneling magnetoresistance of an epitaxial FeÕMgOÕFe/001 junction; Manthan et al.; The American Physical Society; Physical Review B, vol. 63; May 10, 2001; pp. 220403-1 to 220403-4.
Tunnel Magnetoresistance; www.wikipedia.org/wiki/tunnel_manetoresistance; As downloaded from the Internet Jul. 28, 2013; 5 pp.
Variation in the properties of the interface in a CoFeB/MgO/CoFeB tunnel junction during thermal annealing; Jang et al.; Applied Physics Letters, vol. 91; Sep. 4, 2007; pp. 102104-1 to 102104-3.
Zhang et al.; Large magnetoresistance in bcc Co/MgO/Co and FeCo/MgO/FeCo tunnel junctions; The American Physical Society; Physical Review B, vol. 70; Nov. 17, 2004; pp. 172407-1 to 172407-4.

\* cited by examiner

MAGNETIC TUNNEL JUNCTIONS

TECHNICAL FIELD

Embodiments disclosed herein pertain to magnetic tunnel junctions, to methods of forming a magnetic electrode of a magnetic tunnel junction, and to methods of forming a magnetic tunnel junction.

BACKGROUND

A magnetic tunnel junction is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. Electrical resistance between those two nodes through the reference electrode, insulator material, and the recording electrode is dependent upon the magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having about 50% "spin-up" and about 50% "spin-down" electrons). A spin-polarized current is one with significantly more electrons of either spin. By passing a current through certain magnetic material (sometimes also referred to as polarizer material), one can produce a spin-polarized current. If a spin-polarized current is directed into a magnetic material, spin angular momentum can be transferred to that material, thereby affecting its magnetization orientation. This can be used to excite oscillations or even flip (i.e., switch) the orientation/domain direction of the magnetic material if the spin-polarized current is of sufficient magnitude.

An alloy or other mixture of Co and Fe is one common material proposed for use as a polarizer material and/or as at least part of the magnetic recording material of a recording electrode in a magnetic tunnel junction. A more specific example is $Co_xFe_yB_z$ where x and y are each 10-80 and z is 0-50, and may be abbreviated as CoFe or CoFeB. MgO is an ideal material for the non-magnetic tunnel insulator. Ideally such materials are each crystalline having a body-centered-cubic (bcc) 001 lattice. Such materials may be deposited using any suitable technique, for example by physical vapor deposition. One technique usable to ultimately produce the bcc 001 lattice in such materials includes initially forming CoFe to be amorphous and upon which MgO-comprising tunnel insulator material is deposited. During and/or after the depositing, the MgO tunnel insulator, the CoFe, and the tunnel insulator ideally individually achieve a uniform bcc 001 lattice structure.

Boron is commonly deposited as part of the CoFe to assure or provide initial amorphous deposition of the CoFe. Crystallization of the CoFe can occur during or after deposition of the MgO by annealing the substrate at a temperature of at least about 250° C. This will induce the diffusion of B atoms out of the CoFe matrix being formed to allow crystallization into bcc 001 CoFe. Bcc 001 MgO acts as a template during the crystallization of CoFe. However, B in the finished magnetic tunnel junction construction, specifically at the CoFe/MgO interface or inside the MgO lattice, undesirably reduces tunneling magnetoresistance (TMR) of the magnetic tunnel junction.

DETAILED DESCRIPTION OF EXAMPLE EMBODIMENTS

Figure 1:
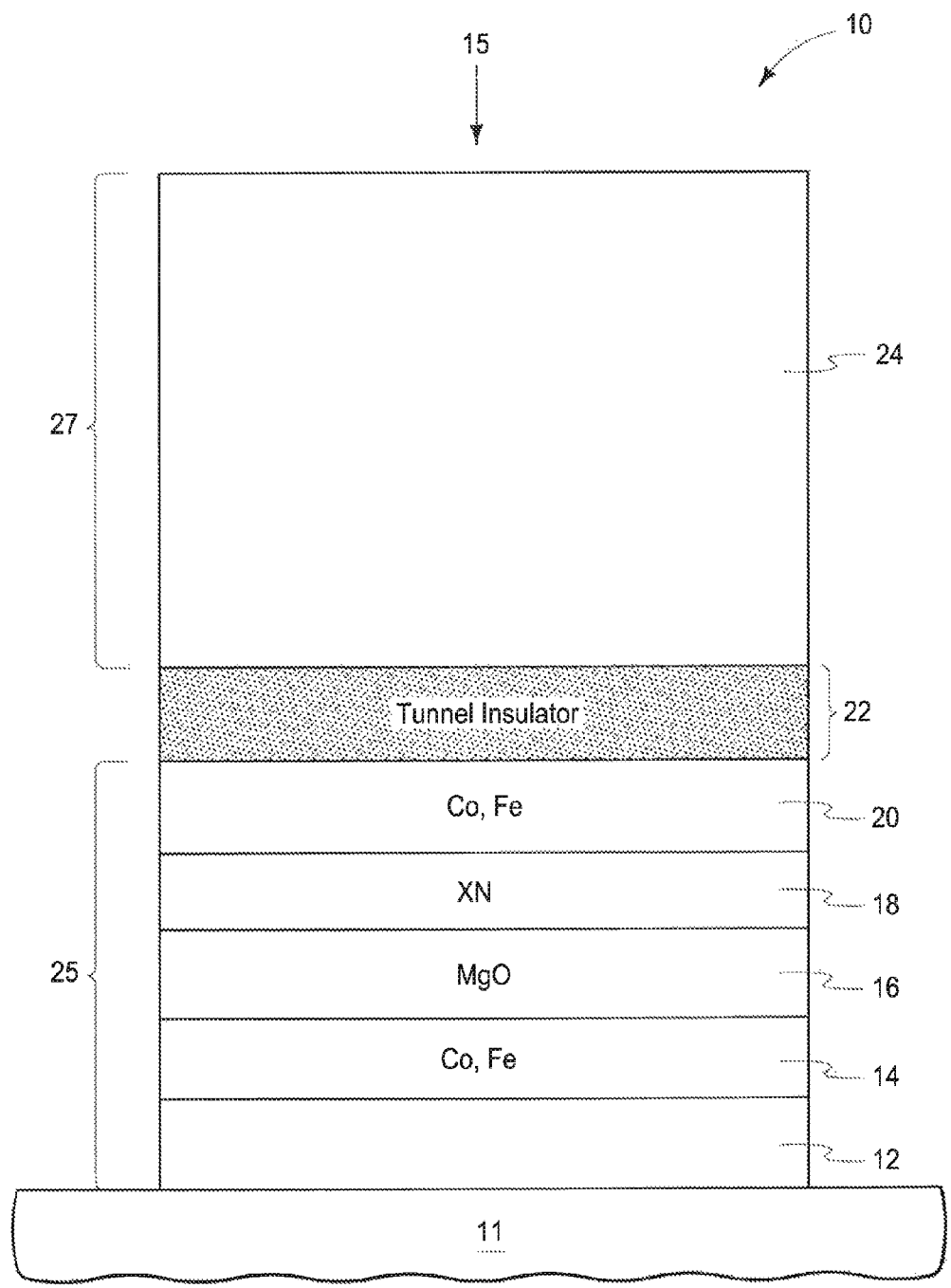
FIG. 1 is a diagrammatic sectional view of a substrate fragment comprising a magnetic tunnel junction in accordance with an embodiment of the invention.

Embodiments of the invention encompass magnetic tunnel junctions. Example embodiments are initially described with reference to FIG. 1 with respect to a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises a base or substrate 11 showing various materials having been formed as an elevational stack there-over. Materials may be aside, elevationally inward, or elevationally outward of the FIG. 1-depicted materials. For example, other partially or wholly fabricated components of integrated circuitry may be provided somewhere about or within fragment 10. Substrate 11 may comprise any one or more of conductive (i.e., electrically herein), semiconductive, or insulative/insulator (i.e., electrically herein) materials. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

A magnetic tunnel junction 15 is over substrate 11, and comprises a conductive first magnetic (i.e., ferrimagnetic or ferromagnetic herein) electrode 25 comprising magnetic recording material and a conductive second magnetic electrode 27 spaced from first electrode 25 and comprising magnetic reference material. A non-magnetic tunnel insulator material 22 (e.g., comprising, consisting essentially of, or consisting of MgO) is between the first and second electrodes. Electrodes 25 and 27 individually may contain non-magnetic insulator, semiconductive, and/or conductive material or regions. However, electrodes 25 and 27 when considered individually are characterized as being overall and collectively magnetic and conductive even though the electrode may have one or more regions therein that are intrinsically locally non-magnetic and/or non-conductive. Further, reference to "magnetic" herein does not require a stated magnetic material or region to be magnetic as initially formed, but does require some portion of the stated magnetic material or region to be functionally "magnetic" in a finished circuit construction of the magnetic tunnel junction.

Example maximum thickness for each of components 25 and 27 is about 20 Angstroms to about 150 Angstroms, and for component 22 about 5 Angstroms to about 25 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials and regions described herein may be of substantially constant thickness or of variable thicknesses. If of variable thickness, thickness refers to average thickness unless otherwise indicated. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", and "against" not preceded by "directly" encompass "directly against" as well as construction where intervening material(s), region(s), or structure(s) result(s) in no physical touching contact of the stated materials, regions, or structures relative one another.

The elevational positions of electrodes 25 and 27 may be reversed and/or an orientation other than an elevational stack may be used (e.g., lateral; diagonal; a combination of one or more of elevational, horizontal, diagonal; etc.). In this document, "elevational", "upper", "lower", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

The magnetic recording material of first electrode 25 comprises a first crystalline magnetic region 20 comprising Co and Fe. Characterization of a material or region as being "crystalline" where used in this document requires at least 90% by volume of the stated material or region to be crystalline. In one embodiment, first crystalline magnetic region 20 comprises B (e.g., $Co_{45}Fe_{45}B_{10}$) and in one alternate embodiment is devoid of B. In this document, "devoid of B" means 0 atomic % B to no more than 0.1 atomic % B. First crystalline magnetic region 20 may comprise, consist essentially of, or consist of Co and Fe. First crystalline magnetic region 20 may comprise, consist essentially of, or consist of Co, Fe, and B. Region 20 when comprising B at 15 atomic percent or greater as initially formed may be amorphous. Subsequent dedicated anneal or inherent high temperature exposure during subsequent processing may remove B from region 20 to a concentration of 0 to about 10 atomic percent whereby region 20 becomes crystalline. In one embodiment, non-magnetic tunnel insulator material 22 comprises MgO, and Co and Fe of first crystalline magnetic region 20 are directly against MgO of non-magnetic tunnel insulator material 22. In one embodiment where B is part of the first crystalline magnetic region and non-magnetic tunnel insulator material 22 comprises MgO, the Co, Fe and B of first crystalline magnetic region 20 are directly against MgO of non-magnetic tunnel insulator material 22. An example thickness for region 20 is about 7 Angstroms to about 20 Angstroms.

First electrode 25 comprises a second amorphous region 18 comprising amorphous XN, where X is one or more of W, Mo, Cr, V, Nb, Ta, Al, and Ti. N is of course nitrogen, and XN is not intended to necessarily imply stoichiometry. Characterization of a material or region as being "amorphous" where used in this document requires at least 90% by volume of the stated material or region to be amorphous. Region 18 may comprise, consist essentially of, or consist of amorphous XN. In one embodiment, amorphous XN of second amorphous region 18 is directly against Co and Fe of first crystalline magnetic region 20. In one embodiment where first crystalline magnetic region 20 comprises B, amorphous XN of second amorphous region 18 is directly against Co, Fe, and B of first crystalline magnetic region 20. In one embodiment, X comprises more than one of W, Mo, Cr, V, Nb, Ta, Al, and Ti (i.e., two or more than two). In one embodiment, the amorphous XN is stoichiometric. In one embodiment, the amorphous XN is non-stoichiometrically N-rich (for example to reduce conductivity from that of stoichiometric XN). In one embodiment, second amorphous region 18 comprising amorphous XN has a maximum thickness no greater than about 10 Angstroms.

In one embodiment, first electrode 25 comprises a non-magnetic MgO-comprising region 16 spaced from non-magnetic tunnel insulator material 22 (e.g., by regions 18 and 20). Region 16 may comprise, consist essentially of, or consist of MgO. In one embodiment, MgO of MgO-comprising region 16 when present is directly against the amorphous XN of second amorphous region 18. An example maximum thickness for MgO-comprising region 16 when present is about 3 Angstroms to about 10 Angstroms.

In one embodiment, first electrode 25 comprises a third crystalline region 14 comprising Co and Fe. In one embodiment, third crystalline region 14 comprises B (e.g., $Co_{45}Fe_{45}B_{10}$) and in one alternate embodiment is devoid of B. An example maximum thickness for region 14 when present is about 4 Angstroms to about 10 Angstroms. In one embodiment where regions 14 and 16 are present, MgO of region 16 is directly against Co and Fe of third crystalline region 14. In one embodiment where regions 14 and 16 are present and region 14 comprises B, MgO of region 16 is directly against Co, Fe, and B of third crystalline region 14. A purpose for including material 14 is to facilitate forming bcc 001 MgO during its deposition. A purpose for including material 16 is to facilitate perpendicular magnetic anisotropy in magnetic material of the conductive magnetic electrode, which is a desirable operational trait of some magnetic tunnel junctions. Like region 20 as described above, region 14 when comprising B at 15 atomic percent or greater as initially formed may be amorphous. Subsequent dedicated anneal or inherent high temperature exposure during subsequent processing may remove B from region 14 to a concentration of 0 to about 10 atomic percent whereby region 14 becomes crystalline.

In one embodiment, first electrode 25 comprises a non-magnetic metal region 12. Examples include one or more elemental metal(s) and an alloy of two or more elemental metals. One specific example material for region 12 is elemental tantalum. An example maximum thickness for metal region 12 when present is about 5 Angstroms to about 500 Angstroms.

Material 24 is shown outwardly of tunnel insulator material 22 and comprises second conductive magnetic electrode 27 of magnetic tunnel junction 15. As but one example, material 24 comprises 13 Angstroms of $Co_{40}Fe_{40}B_{20}$ (molar quantities as initially deposited, not necessarily in final construction) directly against tunnel insulator material 22, 3 Angstroms of Ta directly against the $Co_{40}Fe_{40}B_{20}$, and 40 Angstroms of an alloy/multilayer of Co with Pd/Pt directly against the Ta, with electrode 27 in such example functioning as the magnetic reference electrode. Such materials collectively in such example constitute magnetic reference material thereof.

Figure 2:
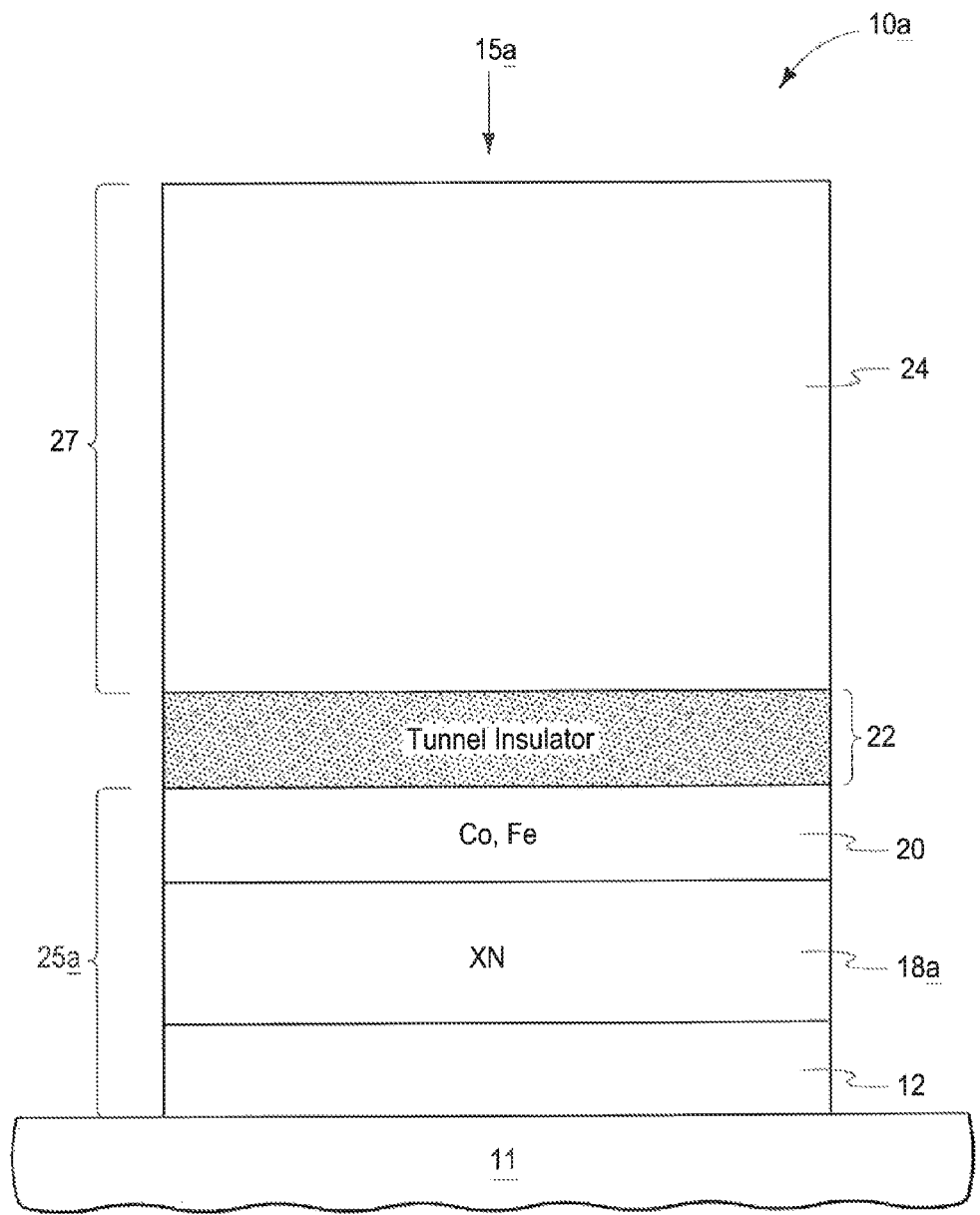
FIG. 2 is a diagrammatic sectional view of a substrate fragment comprising a magnetic tunnel junction in accordance with an embodiment of the invention.

Another example embodiment magnetic tunnel junction 15a is next described with reference to FIG. 2 with respect to a substrate fragment 10a. Like numerals from the above-described embodiments have been used where appropriate, with some construction differences being indicated with the suffix "a". Magnetic tunnel junction 15a is shown as lacking regions 14 and 16 (not shown) from FIG. 1. In one embodiment, amorphous XN of second amorphous region 18a is directly against metal of non-magnetic metal region 12. In one embodiment, second amorphous region 18a comprising amorphous XN has a maximum thickness no greater than about 50 Angstroms, and in one such embodiment a minimum thickness no less than about 20 Angstroms. Any other attribute(s) or aspect(s) as described above and/or shown in FIG. 1 may be used in the FIG. 2 embodiments.

Low required write current is typically desired in magnetic tunnel junctions. Reducing the damping of the magnetic recording material may lower required write current and may be achieved by reducing spin pumping from the magnetic recording material. Spin pumping may be reduced by incorporating XN in a magnetic tunnel junction as described above with respect to the example FIGS. 1 and 2 embodiments, and thereby lower required write current.

Another example embodiment magnetic tunnel junction 15b is next described with reference to FIG. 3 with respect to a substrate fragment 10b. Like numerals from the above-described embodiments have been used where appropriate, with some construction differences being indicated with the suffix "b" or with different numerals. The magnetic recording material of first electrode 25b comprises a first crystalline magnetic region 21 (not necessarily comprising Co and/or Fe). In one embodiment, first crystalline magnetic region 21 comprises Co and Fe. In one embodiment, first crystalline magnetic region 21 comprises B (e.g., $Co_{45}Fe_{45}B_{10}$) and in one alternate embodiment is devoid of B. First crystalline magnetic region 21 may comprise, consist essentially of, or consist of Co and Fe. First crystalline magnetic region 21 may comprise, consist essentially of, or consist of Co, Fe, and B. In one embodiment where non-magnetic tunnel insulator material 22 comprises MgO, the Co and Fe when present in first crystalline magnetic region 21 are directly against MgO of non-magnetic tunnel insulator material 22. In one such embodiment where B is part of first crystalline magnetic region 21, amorphous Co, Fe and B when present in first crystalline magnetic region 20 are directly against MgO of non-magnetic tunnel insulator material 22. An example thickness for region 21 is about 7 Angstroms to about 20 Angstroms.

First electrode 25b comprises a second region 19 comprising Co, Fe, and N (e.g., $Co_xFe_yN_z$ where x and y are each 10 to 80 and z is 0.1 to 50). Region 19 may comprise, consist essentially of, or consist of Co, Fe, and N. In one embodiment where first crystalline magnetic region 21 comprises Co and Fe, the Co and Fe thereof are directly against the Co, Fe, and N of second region 19. In one embodiment, second region 19 is amorphous. In one embodiment, second region 20 is crystalline. Regardless of its final amorphous vs. crystalline state, ideally second region 19 as initially formed is amorphous. In one embodiment where first crystalline magnetic region 21 comprises B, the Co, Fe and B thereof are directly against the Co, Fe, and N of second region 19. In one embodiment, second region 19 comprising Co, Fe, and N has a maximum thickness from about 2 Angstroms to about 15 Angstroms.

In one embodiment, first electrode 25b comprises non-magnetic MgO-comprising region 16 spaced from non-magnetic tunnel insulator material 22 (e.g., by regions 19 and 21). Region 16 may comprise, consist essentially of, or consist of MgO. An example maximum thickness for MgO-comprising region 16 when present is about 3 Angstroms to about 10 Angstroms.

In one embodiment, first electrode 25b comprises third crystalline region 14 comprising Co and Fe. In one embodiment, third crystalline region 14 comprises B (e.g., $Co_{45}Fe_{45}B_{10}$) and in one alternate embodiment is devoid of B. An example maximum thickness for region 14 when present is about 4 Angstroms to about 10 Angstroms. In one embodiment where regions 14 and 16 are present, MgO of region 16 is directly against Co and Fe of third crystalline region 14. In one embodiment where regions 14 and 16 are present and region 14 comprises B, MgO of region 16 is directly against Co, Fe, and B of third crystalline region 14. In one embodiment, an amorphous metal region 17 is between non-magnetic MgO-comprising region 16 and second region 19 comprising Co, Fe, and N. Example amorphous metals for region 17 include one or more of Ta, W, CoFeW, and ZN (where Z is one or more of W, Mo, Cr, V, Nb, Ta, Al, and Ti). An example thickness for region 17 is about 1 Angstrom to about 20 Angstroms. A purpose for including amorphous metal region 17 is to facilitate amorphous growth of second region 19 during its deposition. In one embodiment, MgO of MgO-comprising region 16 is not directly against the Co, Fe, and N of second region 19. As above, a purpose for including material 14 is to facilitate forming bcc 001 MgO during its deposition. A purpose for including material 16 is to facilitate perpendicular magnetic anisotropy in magnetic material of the conductive magnetic electrode. In one embodiment, first electrode 25b comprises non-magnetic metal region 12.

Figure 3:
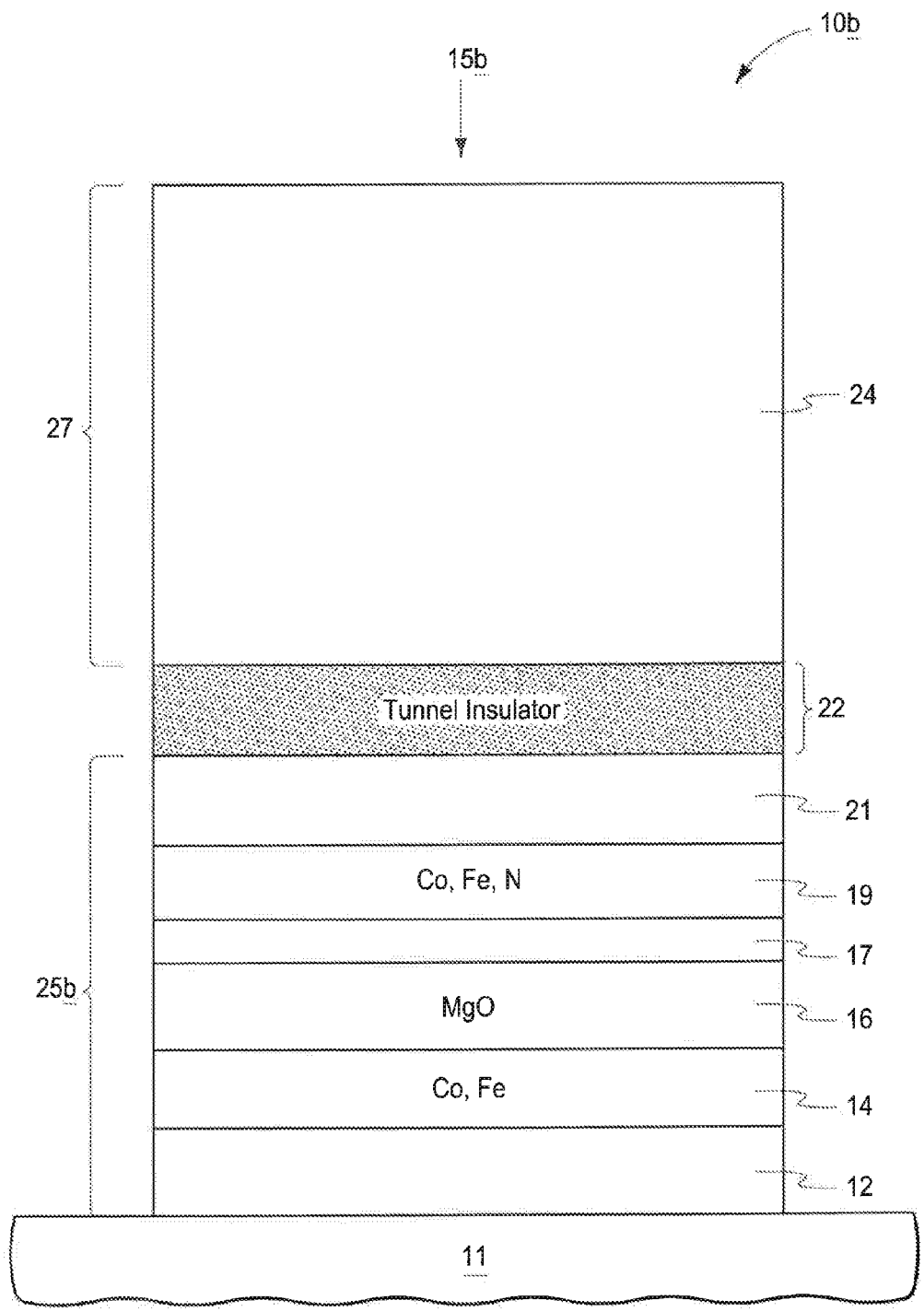
FIG. 3 is a diagrammatic sectional view of a substrate fragment comprising a magnetic tunnel junction in accordance with an embodiment of the invention.

Any other attribute(s) or aspect(s) as described above and/or shown in FIGS. 1 and 2 for components 25/25a, 27, and 22 may be used in the FIG. 3 embodiments.

Figure 4:
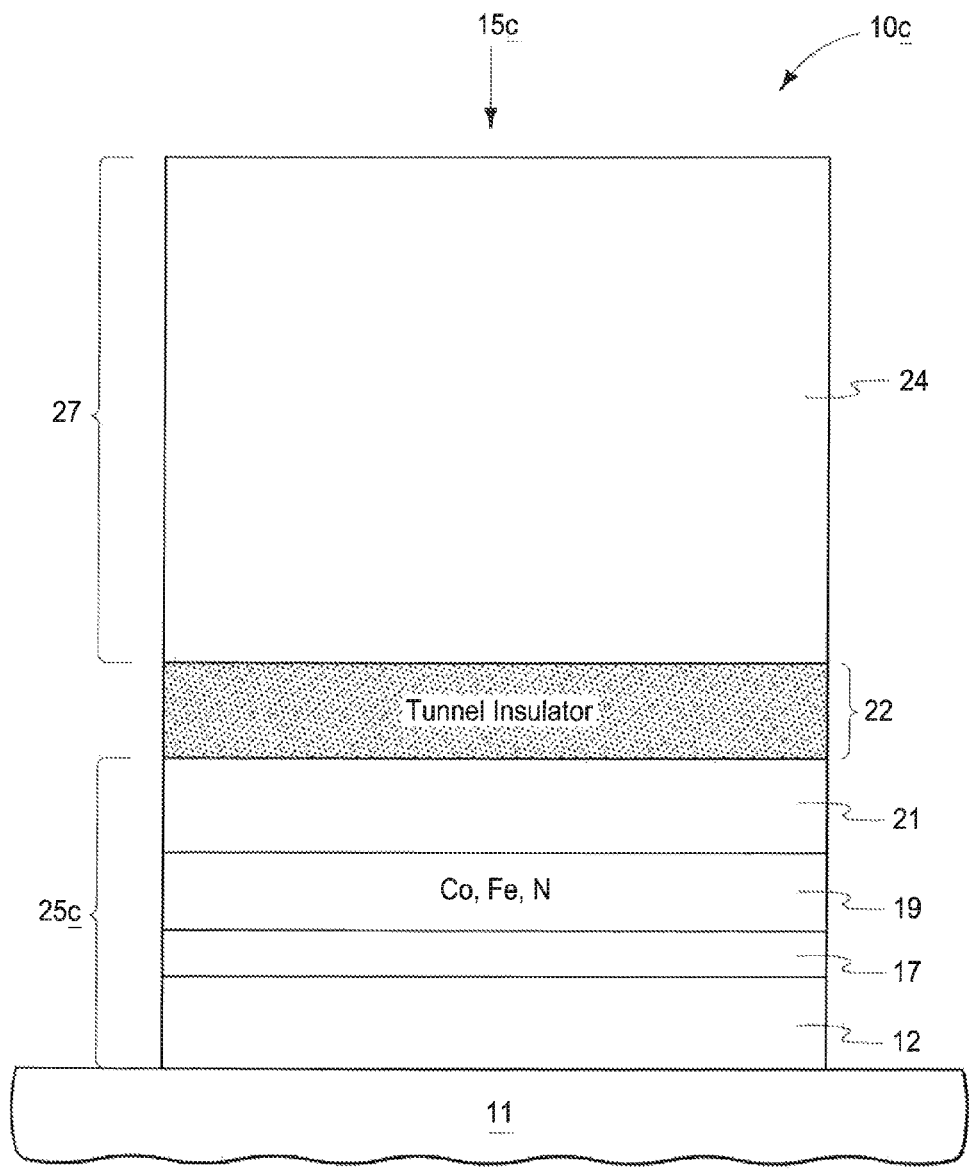
FIG. 4 is a diagrammatic sectional view of a substrate fragment comprising a magnetic tunnel junction in accordance with an embodiment of the invention.

Another example embodiment magnetic tunnel junction 15c is next described with reference to FIG. 4 with respect to a substrate fragment 10c. Like numerals from the above-described embodiments have been used where appropriate, with some construction differences being indicated with the suffix "c". First electrode 25*c* of magnetic tunnel junction 15*c* is shown as lacking regions 14 and 16 (not shown) from FIG. 3. Any other attribute(s) or aspect(s) as described above and/or shown in FIG. 3 may be used in the FIG. 4 embodiments.

Required write current density in a magnetic tunnel junction can be represented as $$J_{c0} = \frac{1}{\eta}\frac{2\alpha e}{\hbar}(M_S t)H_K$$

where $M_S$ is saturation magnetization, t is thickness, and $H_K$ is perpendicular magnetic anisotropy of the magnetic recording material. Using a region comprising Co, Fe, and N in a magnetic tunnel junction as described above with respect to the example FIGS. 3 and 4 embodiments may enable a good balance of low $M_S t$ and high $H_K$ in achieving fast switching, good retention, and low switching current.

CONCLUSION

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The magnetic recording material of the first electrode comprises a first crystalline magnetic region comprising Co and Fe. The first electrode comprises a second amorphous region comprising amorphous XN, where X is one or more of W, Mo, Cr, V, Nb, Ta, Al, and Ti.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The magnetic recording material of the first electrode comprises a first crystalline magnetic region comprising Co, Fe, and B. The first electrode comprises a second amorphous region comprising amorphous XN, where X is one or more of W, Mo, Cr, V, Nb, Ta, Al, and Ti. The Co, Fe, and B of the magnetic recording material is directly against the amorphous XN of the second amorphous region.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The magnetic recording material of the first electrode comprises a first crystalline magnetic region. The first electrode comprises a second region comprising Co, Fe, and N.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The magnetic recording material of the first electrode comprises a first crystalline magnetic region comprising Co, Fe, and B. The first electrode comprises a second region comprising Co, Fe, and N. The Co, Fe, and B of the magnetic recording material are directly against the Co, Fe, and N of the second region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A magnetic tunnel junction comprising:
a conductive first magnetic electrode comprising magnetic recording material;
a conductive second magnetic electrode spaced from the first electrode and comprising magnetic reference material;
a non-magnetic tunnel insulator material between the first and second electrodes; and
the magnetic recording material of the first electrode comprising a first crystalline magnetic region comprising Co and Fe and the first electrode comprising a second amorphous region comprising amorphous XN, where X is one or more of W, Mo, Cr, V, Nb, Ta, Al, and Ti.

2. The magnetic tunnel junction of claim 1 wherein the Co and Fe of the first crystalline magnetic region are directly against the amorphous XN of the second amorphous region.

3. The magnetic tunnel junction of claim 1 wherein the first crystalline magnetic region comprises B.

4. The magnetic tunnel junction of claim 1 wherein the first crystalline magnetic region is devoid of B.

5. The magnetic tunnel junction of claim 1 wherein the amorphous XN is stoichiometric.

6. The magnetic tunnel junction of claim 1 wherein the amorphous XN is non-stoichiometrically N-rich.

7. The magnetic tunnel junction of claim 1 wherein the second amorphous region consists essentially of the amorphous XN.

8. The magnetic tunnel junction of claim 1 wherein the second amorphous region comprising amorphous XN has a maximum thickness no greater than about 10 Angstroms.

9. The magnetic tunnel junction of claim 1 wherein the second amorphous region comprising amorphous XN has a maximum thickness no greater than about 50 Angstroms.

10. The magnetic tunnel junction of claim 9 wherein the second amorphous region comprising amorphous XN has a minimum thickness no less than about 20 Angstroms.

11. The magnetic tunnel junction of claim 1 wherein the first electrode comprises a non-magnetic MgO-comprising region spaced from the non-magnetic tunnel insulator material.

12. The magnetic tunnel junction of claim 11 wherein MgO of the MgO-comprising region is directly against the amorphous XN of the second amorphous region.

13. The magnetic tunnel junction of claim 11 wherein the first electrode comprises a third crystalline region comprising Co and Fe.

14. The magnetic tunnel junction of claim 13 wherein the third crystalline region comprises B.

15. The magnetic tunnel junction of claim 13 wherein the third crystalline region is devoid of B.

16. The magnetic tunnel junction of claim 13 wherein the Co and Fe of the third crystalline region are directly against MgO of the MgO-comprising region.

17. The magnetic tunnel junction of claim 1 wherein the first electrode comprises a non-magnetic metal region, the amorphous XN of the second amorphous region being directly against metal of the non-magnetic metal region.

18. The magnetic tunnel junction of claim 17 wherein the amorphous XN of the second amorphous region is directly against the Co and Fe of the first crystalline magnetic region.

19. The magnetic tunnel junction of claim 1 wherein X comprises more than one of W, Mo, Cr, V, Nb, Ta, Al, and Ti.

20. The magnetic tunnel junction of claim 1 wherein X is one or more of W, Mo, Cr, V, Nb, Ta, and Al.

21. The magnetic tunnel junction of claim 1 wherein the first electrode comprises a third crystalline region comprising Co and Fe that is spaced from the first crystalline magnetic region comprising Co and Fe.

22. The magnetic tunnel junction of claim 21 wherein the amorphous XN is between the first crystalline magnetic region and the third crystalline region.

23. The magnetic tunnel junction of claim 1 wherein,
the first electrode comprises a non-magnetic metal region in addition to said amorphous XN; and
the first electrode comprises a third crystalline region comprising Co and Fe that is spaced from the first crystalline magnetic region comprising Co and Fe.

24. A magnetic tunnel junction comprising:
a conductive first magnetic electrode comprising magnetic recording material;
a conductive second magnetic electrode spaced from the first electrode and comprising magnetic reference material;
a non-magnetic tunnel insulator material between the first and second electrodes; and
the magnetic recording material of the first electrode comprising a first crystalline magnetic region comprising Co, Fe, and B, and the first electrode comprising a second amorphous region comprising amorphous XN, where X is one or more of W, Mo, Cr, V, Nb, Ta, Al, and Ti; the Co, Fe, and B of the magnetic recording material being directly against the amorphous XN of the second amorphous region.

25. The magnetic tunnel junction of claim 24 wherein the non-magnetic tunnel insulator comprises MgO; the Co, Fe, and B of the first crystalline magnetic region being directly against MgO of the non-magnetic tunnel insulator material.

26. A magnetic tunnel junction comprising:
a conductive first magnetic electrode comprising magnetic recording material;
a conductive second magnetic electrode spaced from the first electrode and comprising magnetic reference material;
a non-magnetic tunnel insulator material between the first and second electrodes; and
the magnetic recording material of the first electrode comprising a first crystalline magnetic region and the first electrode comprising a second region comprising Co, Fe, and N.

27. The magnetic tunnel junction of claim 26 wherein the second region consists essentially of the Co, Fe, and N.

28. The magnetic tunnel junction of claim 26 wherein the first crystalline magnetic region comprises Co and Fe.

29. The magnetic tunnel junction of claim 28 wherein the Co and Fe of the first crystalline magnetic region are directly against the Co, Fe, and N of the second region.

30. The magnetic tunnel junction of claim 28 wherein the first crystalline magnetic region comprises B.

31. The magnetic tunnel junction of claim 28 wherein the first crystalline magnetic region is devoid of B.

32. The magnetic tunnel junction of claim 28 wherein the first electrode comprises a non-magnetic MgO-comprising region spaced from the non-magnetic tunnel insulator material.

33. The magnetic tunnel junction of claim 32 comprising an amorphous metal region between the non-magnetic MgO-comprising region and the second region comprising Co, Fe, and N.

34. The magnetic tunnel junction of claim 32 wherein MgO of the MgO-comprising region is not directly against the Co, Fe, and N of the second region comprising Co, Fe, and N.

35. The magnetic tunnel junction of claim 32 wherein the first electrode comprises a third crystalline region comprising Co and Fe.

36. The magnetic tunnel junction of claim 35 wherein the third crystalline region comprises B.

37. The magnetic tunnel junction of claim 35 wherein the third crystalline region is devoid of B.

38. The magnetic tunnel junction of claim 35 wherein the Co and Fe of the third crystalline region are directly against MgO of the MgO-comprising region.

39. The magnetic tunnel junction of claim 26 wherein the first electrode comprises an amorphous metal region, the Co, Fe, and N of the second region being directly against amorphous metal of the amorphous metal region.

40. The magnetic tunnel junction of claim 26 wherein the first electrode comprises a non-magnetic metal region.

41. The magnetic tunnel junction of claim 26 wherein the second region is crystalline.

42. The magnetic tunnel junction of claim 26 wherein the second region is amorphous.

43. A magnetic tunnel junction comprising:
a conductive first magnetic electrode comprising magnetic recording material;
a conductive second magnetic electrode spaced from the first electrode and comprising magnetic reference material;
a non-magnetic tunnel insulator material between the first and second electrodes; and
the magnetic recording material of the first electrode comprising a first crystalline magnetic region comprising Co, Fe, and B, and the first electrode comprising a second region comprising Co, Fe, and N; the Co, Fe, and B of the magnetic recording material being directly against the Co, Fe, and N of the second region.

44. The magnetic tunnel junction of claim 43 wherein the non-magnetic tunnel insulator comprises MgO; the Co, Fe, and B of the first crystalline magnetic region being directly against MgO of the non-magnetic tunnel insulator material.

* * * * *